United States Patent [19]
Kim

[11] Patent Number: 6,043,711
[45] Date of Patent: Mar. 28, 2000

[54] GATE BIAS CIRCUIT OF A POWER AMPLIFIER FET

[75] Inventor: Chang Tae Kim, Seoul, Rep. of Korea

[73] Assignee: LG Electronics, Inc., Seoul, Rep. of Korea

[21] Appl. No.: 09/055,344

[22] Filed: Apr. 6, 1998

[30] Foreign Application Priority Data

Apr. 12, 1997 [KR] Rep. of Korea .................. 97/07621

[51] Int. Cl.$^7$ ............................................. H03F 3/16
[52] U.S. Cl. ................................... 330/277; 330/296
[58] Field of Search ........................ 330/277, 296, 330/285

[56] References Cited

U.S. PATENT DOCUMENTS

| | | | |
|---|---|---|---|
| 4,004,164 | 1/1977 | Cranford, Jr. et al. | 307/297 |
| 4,987,382 | 1/1991 | Saitoh | 330/277 |
| 5,412,235 | 5/1995 | Nakajima et al. | 257/272 |
| 5,821,814 | 10/1998 | Katayama | 330/277 |

*Primary Examiner*—Robert Pascal
*Assistant Examiner*—Henry Choe
*Attorney, Agent, or Firm*—Fleshner & Kim

[57] ABSTRACT

A gate bias circuit of a power amplifier FET, for maintaining a constant operating point, by changing a gate bias voltage, corresponding to a fluctuation of threshold voltage in the respective products of FET, has a construction at least one gate bias FET having a threshold voltage the same with a threshold voltage of the power amplifier FET and having a gate width narrower than a gate width of the power amplifier FET, the bias FET being connected to the gate power amplifier FET which is adapted to receive an input signal, for obtaining a constant current.

11 Claims, 3 Drawing Sheets

6,043,711

GATE BIAS CIRCUIT OF A POWER AMPLIFIER FET

BACKGROUND OF THE INVENTION

1. Field of the Invention

The present invention relates to a gate bias circuit of a power amplifier FET. More particularly, it relates to such a gate bias circuit of a power amplifier FET, for maintaining a specific operating current, by a compensation of deviation of a threshold voltage among each device, caused by irregularity of production processing in GaAs FET for power amplification.

2. Discussion of Related Art

As shown in FIG. 1, a conventional gate bias circuit of a power amplifier FET includes a gate G of an FET 1, to which a bias voltage formed by dividing DC voltage VDD with a resistor $R_1$ and a resistor $R_2$ which are, in series, connected to each other, is applied, and an input terminal 2 connected through a condenser 3.

A drain D of the FET 1 is connected to an output terminal 7 via resistor 4, resistor 5 and condenser 6. A drain bias terminal 9 where a drain voltage $V_{dd}$ is connected, is connected to a connection point of the resistor 4 and resistor 5 via a choke coil 8 for blocking a high frequency, and simultaneously, is grounded via a condenser 10 for blocking a direct current.

A high frequency signal input to the input terminal 2 is transmitted to the gate G of FET 1 via the condenser 3, in the above-described gate bias circuit of a power amplifier FET.

A gate voltage of $Vg = V_{DD} R_2/R_1 + R_2$, formed by dividing a DC voltage $V_{DD}$ which is applied to a gate bias terminal 12, with a resistor $R_1$ and a resistor $R_2$, is applied to the gate G of FET 1.

When the gate voltage Vg is applied and the drain voltage $V_{dd}$ is applied to the drain bias terminal 9, a drain current ID which is determined by DC characteristics of FET 1, the gate voltage Vg and the drain voltage $V_{dd}$, gets to flow from the drain D to the source S.

By this, the high frequency signal applied to the gate G of FET 1 via the condenser 3, is amplified to output via the resistor 4, resistor 5, and condenser 6.

Regarding curve b in FIG. 2, the drain current ID is determined by a threshold voltage Vth, the gate voltage Vg and a gain coefficient K in accordance with the formula (1) given as follows;

$$ID = K(Vg - Vth)^2 \tag{1}$$

When the threshold voltage Vth is constant, the drain current ID is determined by the gate voltage Vg, and an operating point Q is also determined, as depicted in FIG. 3. FET's output characteristics and efficiency, etc. vary with a position of operating point Q. In this regard, the operating point Q, i.e., an operating current Iop, is to be constant, to thereby obtain constant device characteristics.

However, the conventional gate bias circuit of power amplifier FET includes the constant DC voltage $V_{DD}$ which is applied to the gate bias terminal 12, fixed resistors $R_1$ and $R_2$ as well as the constant gate voltage of $Vg = V_{DD} R_2/R_1 + R_2$ which is applied to the gate G of FET 1.

When the threshold voltage Vth changes, therefore, the drain current ID is also changed, as known by the formula (1).

That is to say, when the gate voltage Vg is constant and the threshold voltage Vth changes, based on the formula (1), ID varies with the quadratic function of the threshold voltage Vth, varies the curve a or c in FIG. 2 according to the increase and/or decrease of the threshold voltage Vth.

The operating point is, therefore, shifted from Q to $Q_1$ or $Q_2$, causing the operating current Iop to largely vary with the change of the threshold voltage Vth, as illustrated in FIG. 3.

In the meantime, the threshold voltage Vth of every product FET is not constant by environment and materials, during fabricating of FET.

Therefore, the conventional gate bias circuit of a power amplifier FET suffers the disadvantages, in that each of the products has different threshold voltages, causing the operating point Q, i.e., operating current Iop to be changed, thereby varying the output characteristics and efficiency of the FET.

SUMMARY OF THE INVENTION

Accordingly, the present invention is directed to a gate bias circuit of a power amplifier FET that substantially obviates one or more of the problems due to limitations and disadvantages of the related art.

An object of the present invention is to provide a gate bias circuit of a power amplifier FET, which maintains a constant operating point, by changing a gate bias voltage, corresponding to a fluctuation of threshold voltage in the respective products of FET.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a gate bias circuit of power amplifier FET has a structure that includes at least one gate bias FET having a s threshold voltage the same as a threshold voltage of the power amplifier FET and having a gate width narrower than a gate width of the power amplifier FET, the gate bias FET being connected to the gate of the power amplifier FET which is adapted to receive an input signal, for obtaining constant current.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention:

DETAILED DESCRIPTION OF PREFERRED EMBODIMENT

Reference will now be made in detail to the preferred embodiments of the present invention, examples of which are illustrated in the accompanying drawings.

Figure 1:
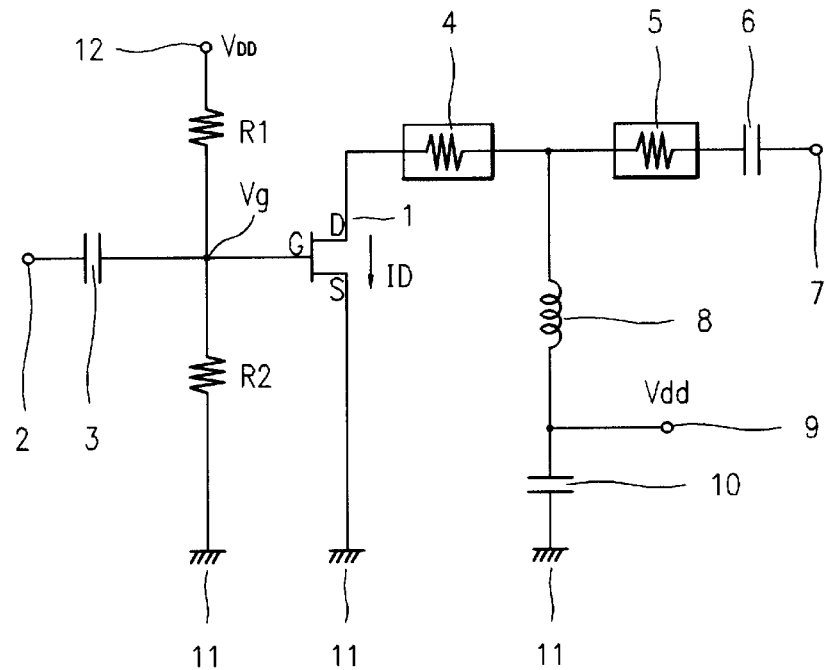
FIG. 1 shows a conventional, fixed gate bias circuit.
Figure 2:
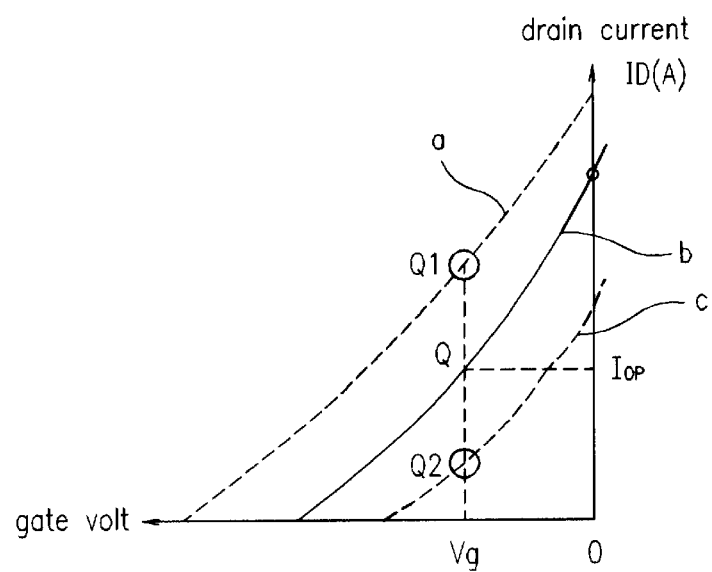
FIG. 2 shows a movement of operating point in accordance with the change of threshold voltage in the conventional gate bias circuit.
Figure 3:
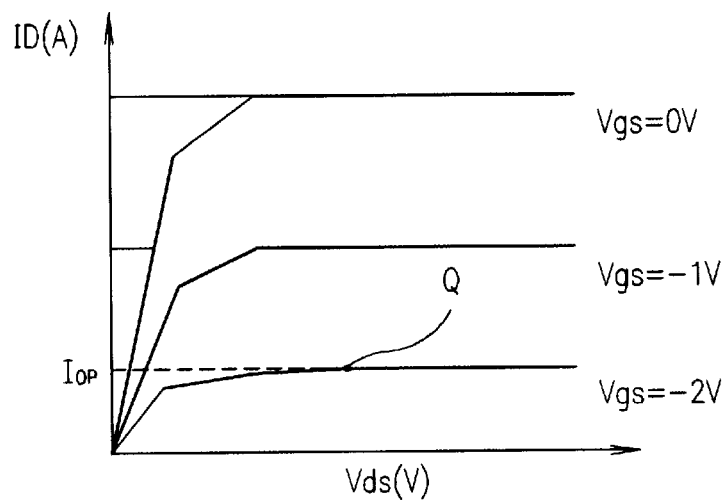
FIG. 3 depicts a gate bias voltage and drain current in the conventional gate bias circuit.
Figure 4:
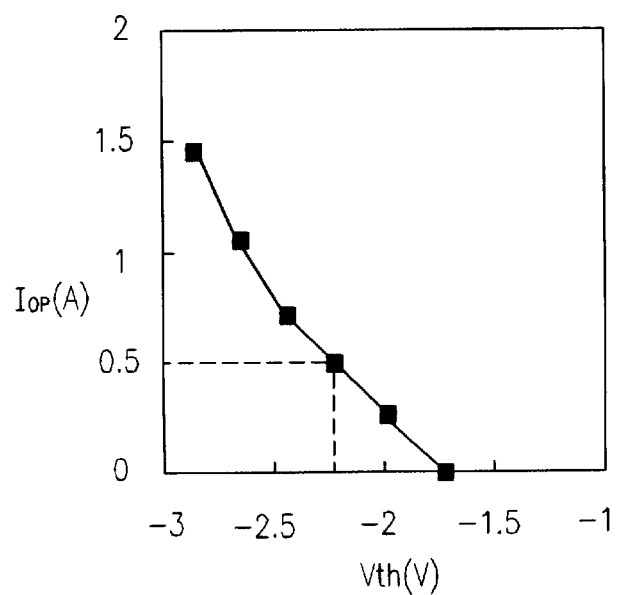
FIG. 4 shows the change of operating current in response to the change of threshold voltage of FET, in conventional power amplifier FET.
Figure 5:
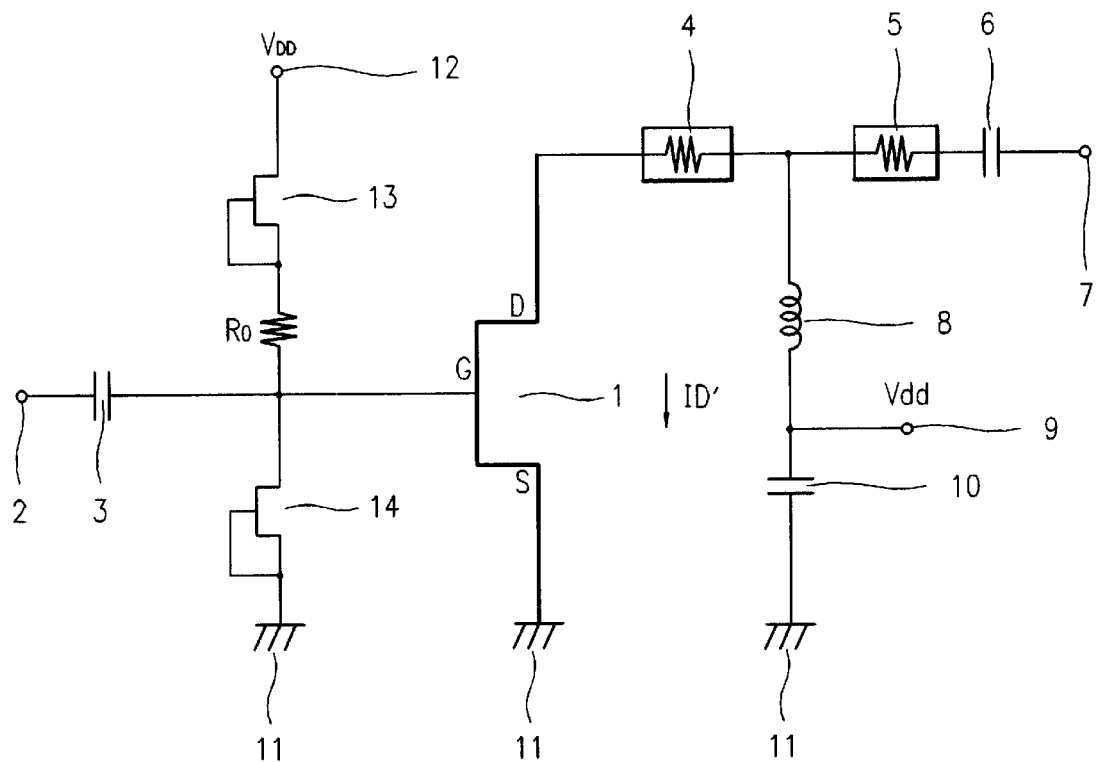
FIG. 5 illustrates a gate bias circuit of power amplifier FET according to the present invention.

FIG. 5 is a circuit diagram of gate bias circuit of power amplifier FET, showing a preferred embodiment of the present invention. The conventional gate bias circuit of power amplifier FET, as shown at FIG. 1, has a construction that connects in series a gate bias resistor $R_1$ with a gate bias resistor $R_2$, between a bias power supply 12 and a ground 11, to divide DC voltage $V_{DD}$ with the fixed resistors $R_1$ and $R_2$ and apply the divided voltage to gate terminal of the power amplifier FET 1. The gate bias circuit of the present invention has a construction that connects in series a resistor $R_0$ with an FET 13 of gate-source common connection having the same threshold voltage as the power amplifier FET 1, and uses an FET 14 of gate-source common connection having the same threshold voltage as the power amplifier FET and a gate width narrower than that of the power amplifier FET 1. The circuit construction of the conventional gate bias circuit and present invention is the same, except for the above. Therefore, same constituent elements are designated by the same reference numerals, and explanation thereof will be omitted.

The following description will now relate to the operation of the gate bias circuit of power amplifier FET of the present invention.

According to the present invention, the gate bias FET 13 and FET 14 are simultaneously fabricated, in the same environment, by using the same materials as the power amplifier FET. Thus, these FETs may be fabricated to have the same threshold voltage.

When the power amplifier FET which has the same threshold voltage as the gate bias FET 13 and FET 14, increases in threshold voltage Vth, as compared to a set value, a saturation current (the voltage between gate and source is 0 V) of the gate bias FET 13 and FET 14 also increases, resulting in an increase in voltage drop of the resistor $R_0$.

In this connection, the voltage applied to the gate of the power amplifier FET varies to a negative value, giving rise to a decrease in operating current Iop.

On the other hand, when the threshold voltage Vth of the power amplifier FET 1 is reduced, as compared to a set value, a saturation current of the gate bias FET 13 and FET 14 are also reduced, resulting in reductions in voltage drop of the resistor $R_0$. Therefore, the voltage applied to the gate of the power amplifier FET is varied to a positive value, causing an operating current Iop to increase.

Figure 6:
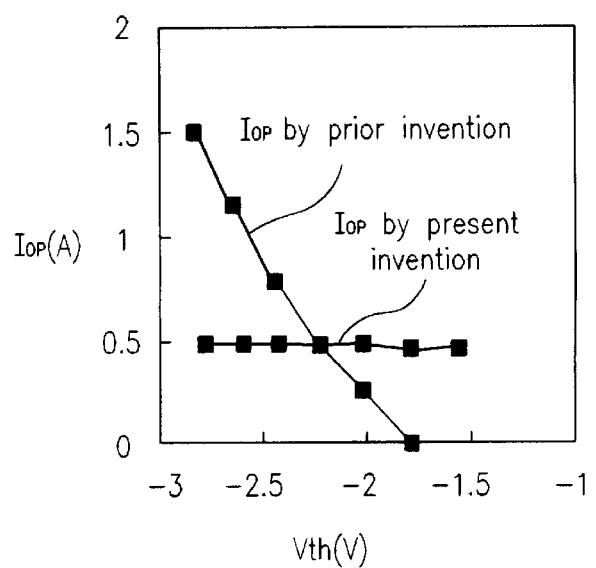
FIG. 6 shows the change of operating current corresponding to the change of threshold voltage of FET, in the present invention and prior art.

Accordingly, the operating current Iop is almost maintained in a constant state, an experimental result of which is shown as FIG. 6.

In the present invention, although the threshold voltage of the power amplifier FET 1, is in the range of −1.8 V to −2.8 V, the operating current Iop is maintained in a 0.5 A state, while the operating current Iop is continuously reduced according to increase of the threshold voltage in the conventional gate bias circuit.

As described above, according to the gate bias circuit of the power amplifier FET of the present invention, when the threshold voltage of the power amplifier FET is changed, causing the operating current to change, the saturation current of the gate bias FET is also varied, in such a way that the operating current Iop is maintained in a constant state, to preclude the variation of operating point caused by products' deviation, thereby attaining the constant DC characteristics and efficiency.

It will be apparent to those skilled in the art that various modifications and variations can be made in a gate bias circuit of a power amplifier FET of the present invention without departing from the spirit or scope of the invention. Thus, it is intended that the present invention cover the modifications and variations of this invention provided they come within the scope of the appended claims and their equivalents.

What is claimed is:

1. A gate bias circuit of a power amplifier FET, the gate bias circuit comprising:

a first gate bias FET of a gate source common connection connected in series with a resistor between a bias power supply and a gate of the power amplifier FET; and a second gate bias FET of the gate source common connection connected between the gate of the power amplifier FET and a ground terminal, wherein the first and second gate bias FETs have a threshold voltage the same as a threshold voltage of the power amplifier FET and having a gate width narrower than a gate width of the power amplifier FET, the first and second bias FETs being connected to the gate power amplifier FET, which is adapted to receive an input signal, for obtaining a constant current.

2. The gate bias circuit of claim 1, wherein the first and second gate bias FETs are simultaneously fabricated with the power amplifier FET.

3. The gate bias circuit of claim 1, wherein the first and second gate bias FETs are fabricated in the same environment as the power amplifier FET.

4. The gate bias circuit of claim 1, wherein the first and second gate bias FETs are fabricated using the same materials as the power amplifier FET.

5. The gate bias circuit of claim 1, wherein saturation currents of the first and second gate bias FETs are varied based on a change in the threshold voltage of the power amplifier FET to maintain the constant current.

6. A gate bias circuit for a power amplifier transistor, comprising:

a first transistor having first and second electrodes and a control electrode, the first electrode for coupling to a first voltage potential;

a resistor having first and second electrodes, the first electrode being coupled to the second electrode of the first transistor; and a second transistor having first and second electrodes and a control electrode, the first electrode of the second transistor being coupled to the second electrode of the resistor and a control electrode of the power amplifier transistor, the second electrode of the second transistor for coupling to a second voltage potential, wherein the first and second transistors have a gate width narrower than a gate width of the power amplifier transistor.

7. The gate bias circuit of claim 6, wherein:

the second electrode of the first transistor is coupled to the control electrode of the first transistor; and the second electrode of the second transistor is coupled to the control electrode of the second transistor.

8. The gate bias circuit of claim 6, further comprising a condenser coupled to the second electrode of the resistor, the first electrode of the second transistor and the control electrode of the power amplifier transistor.

9. The gate bias circuit of claim 6, wherein the first and second transistors have a threshold voltage substantially equal to a threshold voltage of the power amplifier transistor.

10. The gate bias circuit of claim 6, wherein the first and second voltage potentials are a drain voltage and a ground, respectively.

11. The gate bias circuit of claim 6, wherein the control electrode of the power amplifier transistor is coupled to the second electrode of the resistor and the first electrode of the second transistor for obtaining a constant current.

* * * * *